(12) United States Patent
Suzuki et al.

(10) Patent No.: US 9,076,649 B2
(45) Date of Patent: Jul. 7, 2015

(54) FILM FORMING METHOD AND APPARATUS

(71) Applicant: TOKYO ELECTRON LIMITED, Tokyo (JP)

(72) Inventors: Keisuke Suzuki, Nirasaki (JP); Kentaro Kadonaga, Nirasaki (JP); Volker Hemel, Dresden (DE); Bernhard Zobel, Dresden (DE)

(73) Assignee: TOKYO ELECTRON LIMITED, Tokyo (JP)

( * ) Notice: Subject to any disclaimer, the term of this patent is extended or adjusted under 35 U.S.C. 154(b) by 46 days.

(21) Appl. No.: 13/905,734

(22) Filed: May 30, 2013

(65) Prior Publication Data
US 2013/0323935 A1  Dec. 5, 2013

(30) Foreign Application Priority Data

Jun. 2, 2012 (JP) .................................. 2012-126632
Feb. 26, 2013 (JP) .................................. 2013-035472

(51) Int. Cl.
*H01L 21/31* (2006.01)
*H01L 21/02* (2006.01)
*C23C 16/34* (2006.01)
*C23C 16/455* (2006.01)

(52) U.S. Cl.
CPC ...... *H01L 21/02271* (2013.01); *H01L 21/0217* (2013.01); *H01L 21/02211* (2013.01); *H01L 21/02274* (2013.01); *H01L 21/0228* (2013.01); *C23C 16/345* (2013.01); *C23C 16/45512* (2013.01); *C23C 16/45525* (2013.01); *C23C 16/45561* (2013.01)

(58) Field of Classification Search
None
See application file for complete search history.

(56) References Cited

U.S. PATENT DOCUMENTS

2008/0318439 A1* 12/2008 Ito et al. ......................... 438/778
2011/0318905 A1* 12/2011 Chiruvolu et al. ............. 438/478

FOREIGN PATENT DOCUMENTS

| JP | 6-45256 A | 2/1994 |
| JP | 11-87341 A | 3/1999 |
| JP | 2004-6801 A | 1/2004 |
| JP | 2004-134466 A | 4/2004 |
| JP | 2004-228602 A | 8/2004 |
| JP | 2006-287194 A | 10/2006 |
| JP | 2010-90413 A | 4/2010 |
| JP | 2012-67328 A | 4/2012 |

* cited by examiner

*Primary Examiner* — Yasser A Abdelaziez
(74) *Attorney, Agent, or Firm* — Nath, Goldberg & Meyer; Jerald L. Meyer

(57) ABSTRACT

A method of forming a thin film on a surface of target objects in a vacuum-evacuable processing chamber by using a source gas and a reaction gas includes: forming a mixed gas by mixing the source gas and an inert gas in a gas reservoir tank, and supplying the mixed gas and the reaction gas into the processing chamber.

15 Claims, 9 Drawing Sheets

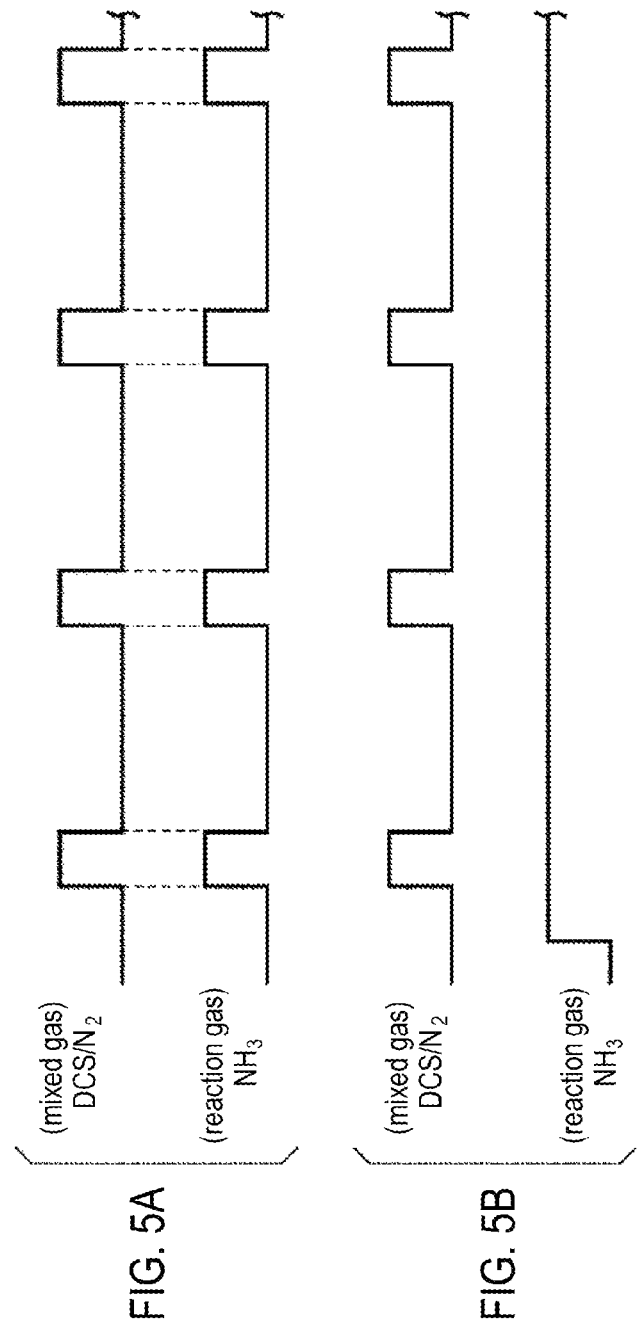

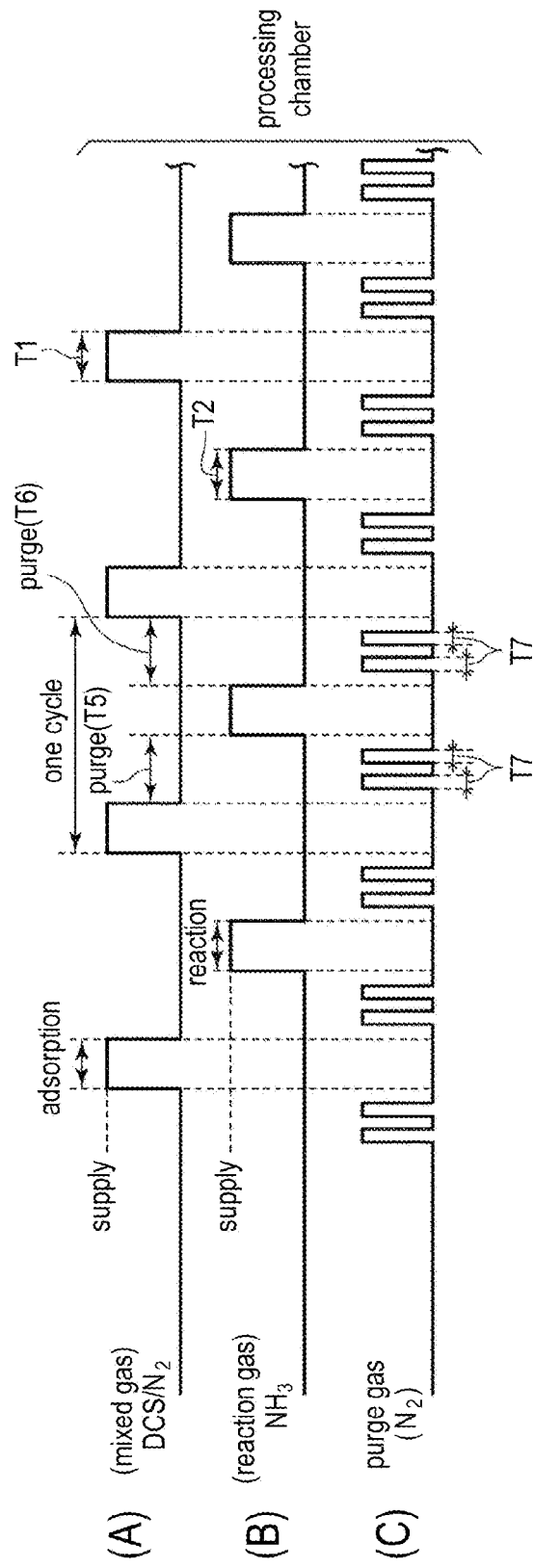

FILM FORMING METHOD AND APPARATUS

CROSS-REFERENCE TO RELATED APPLICATIONS

This application claims the benefit of Japanese Patent Application No. 2012-126632, filed on Jun. 2, 2012 and Japanese Patent Application No. 2013-035472 filed on Feb. 26, 2013, in the Japan Patent Office, the disclosures of which are incorporated herein in its entirety by reference.

TECHNICAL FIELD

The present disclosure relates to a method of forming a thin film on target objects such as a semiconductor wafer and a film forming apparatus.

BACKGROUND

In manufacturing semiconductor integrated circuits, a semiconductor wafer made of a silicon substrate is generally subjected to various processes, e.g., film formation, etching, oxidation, diffusion, modification and native oxide film removal. These processes are carried out by a single wafer processing apparatus which processes wafers one-by-one or by a batch type processing apparatus, which processes a plurality of wafers simultaneously. When performing the processes using a vertical batch type processing apparatus, for example, the wafers are first loaded from a cassette accommodating therein a plurality of wafers, e.g., 25 wafers, into a vertical wafer boat, and then supported by the boat in multi-levels.

The number of wafers loaded into the wafer boat depends on, for example, the size of the wafers, but about 30 to 150 wafers may be loaded onto the wafer boat. The wafer boat is loaded into a gas-evacuable processing chamber from the bottom, and then the interior of the processing chamber is kept airtight. Thereafter, a heat treatment is performed while controlling various processing conditions such as flow rates of processing gases, a processing pressure and a processing temperature.

From among several factors improving characteristics of semiconductor integrated circuits, it is important to improve the characteristics of insulating films in semiconductor integrated circuits. $SiO_2$, PSG (Phospho Silicate Glass), P—SiO (Plasma SiO), P—SiN (Plasma SiN), SOG (Spin On Glass) and $Si_3N_4$ (silicon nitride film) are used as the insulating films in semiconductor integrated circuits. Particularly, silicon nitride films tends to be broadly used since they have an insulating property relatively better than silicon oxide films and serves sufficiently well as etching stopper films or inter-layer insulating films.

Recently, demand for lower dielectric constants (low-k) and an improvement of an etching resistance has increased in order to improve characteristics of circuit elements. In such circumstances, since a desired process using a vertical batch-type film forming apparatus can be performed on a wafer without exposing the wafer to a high temperature, a film forming method, which forms a film by repeatedly depositing one or several layers at an atomic level or one or several layers at a molecular level while intermittently supplying source gases, has been suggested. Such a film forming method is called as an atomic layer deposition (ALD) method.

In a conventional ALD method, a silicon nitride (SiN) film is formed by using a dichlorosilane (hereinafter, referred to as "DCS") gas as a silicon-containing source gas and a $NH_3$ gas as a nitriding gas. Specifically, the DCS gas and the $NH_3$ gas are alternately and intermittently supplied into a processing chamber and an RF (high frequency) power is applied when supplying the $NH_3$ gas to thereby generate a plasma and accelerate a nitridation process.

Alternatively, the $NH_3$ gas can be activated by using heat without generating the plasma. As described above, one or several layers of the DCS at a molecular level are adsorbed on a wafer surface by supplying the DCS gas into the processing chamber, and a residual DCS gas is purged by an inert gas or discharged by vacuum-evacuation. Thereafter, a nitride film is formed by supplying the $NH_3$ gas and accelerating a nitridation process at a low temperature. A series of these procedures are repeatedly performed.

There have also been known several methods to meet a recent demand for increasing a film forming rate or a concentration of silicon in a film. In one method, a buffer tank with a certain capacity is installed in a supply passage of a source gas and a large amount of source gas is temporarily stored in the buffer tank and discharged from the buffer tank when supplying a processing gas, so that the large amount of source gas is intermittently supplied into the processing chamber. In another method, a first tank for charging the source gas is installed at the downstream side of the supply passage of the source gas and a second tank for charging a pressurized $N_2$ gas is installed at the upstream side of the supply passage of the source gas, so that a moving velocity of the source gas is accelerated by the pressurized $N_2$ gas and a gas partial pressure of the source gas in the processing chamber increases.

The large amount of source gas can be supplied in a pulse-like manner and within a short time by installing the buffer tank in the supply passage of the source gas as described above, which results in an increase in the film forming rate. However, supplying the large amount of source gas as described above may cause a problem in that an in-plane uniformity of a silicon nitride film on a wafer surface is deteriorated. This problem cannot be solved by increasing the gas partial pressure of the source gas in the processing chamber as described above.

SUMMARY

The various embodiments of the present disclosure provides at least a method of forming a film and a film forming apparatus, which is capable of improving an in-plane uniformity of a film thickness while maintaining a high film forming rate.

According to a first aspect of the present disclosure, there is provided a method of forming a thin film on a surface of target objects in a vacuum-evacuable processing chamber by using a source gas and a reaction gas including: forming a mixed gas by mixing the source gas and an inert gas in a gas reservoir tank; and supplying the mixed gas and the reaction gas into the processing chamber.

According to a second aspect of the present disclosure, there is provided a film forming apparatus for forming a thin film on a surface of target objects by using a source gas and a reaction gas including: a vacuum-evacuable processing chamber; a holding unit configured to hold the target objects in the processing chamber; a heating unit configured to heat the target objects; a mixed gas supply unit configured to form a mixed gas of the source gas and an inert gas in a gas reservoir tank and supply the mixed gas into the processing chamber, the gas reservoir tank being provided in a gas passage through which the source gas flows and being connected to an inert gas supply system configured to supply an inert gas; a reaction gas supply unit configured to supply the reaction gas into the processing chamber; and a control unit configured to control the apparatus to perform the method of the first aspect.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 5A and 5B are timing diagrams showing an operation of supplying each of the gases into the processing chamber, according to a second and a third embodiment of the film forming method, respectively.

FIG. 6 is a timing diagram showing an operation of supplying each of the gases into the processing chamber, according to a fourth embodiment of the film forming method.

DETAILED DESCRIPTION

Reference will now be made in detail to the various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
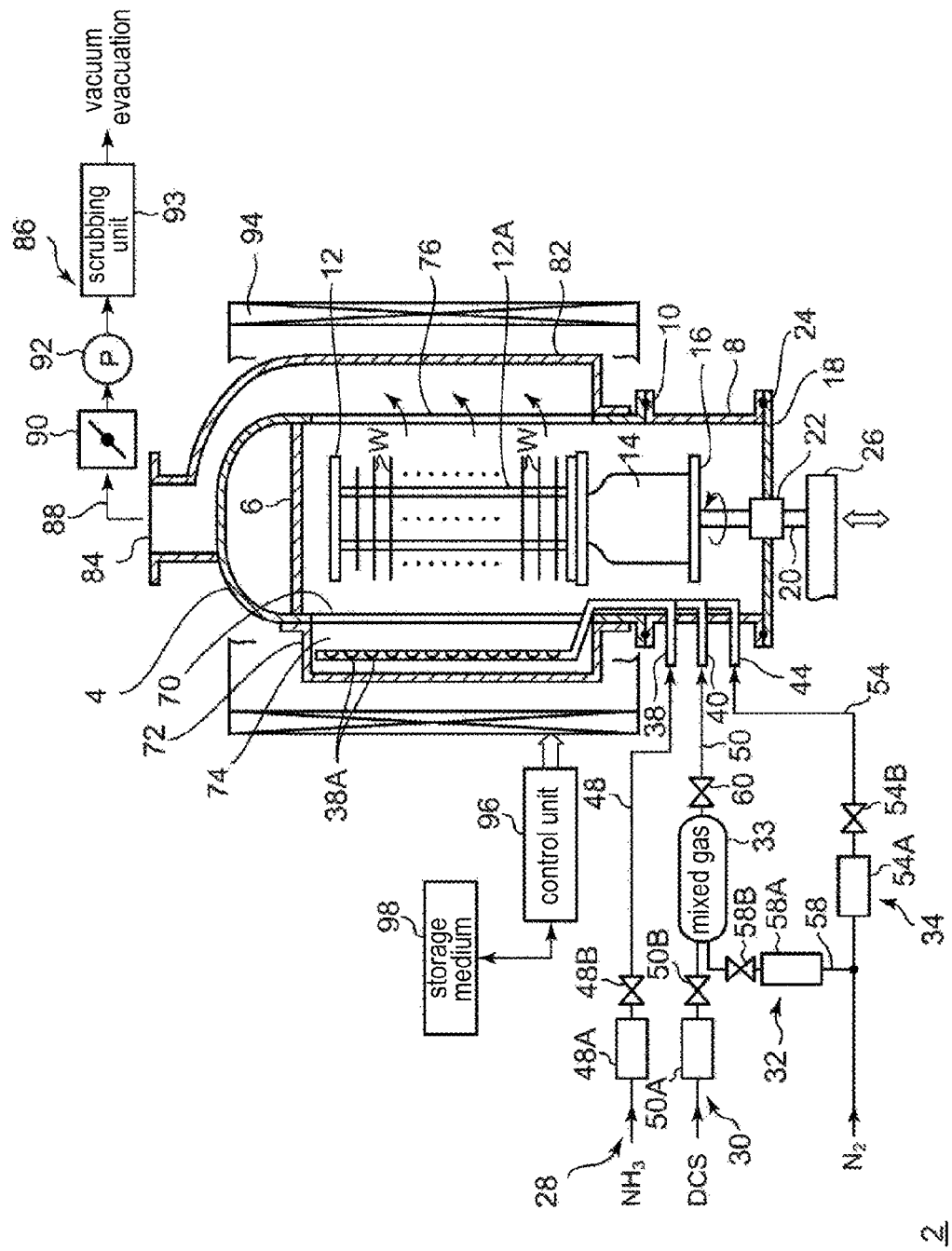
FIG. 1 is a vertical cross sectional view showing one example of a film forming apparatus, according to some embodiments.
Figure 2:
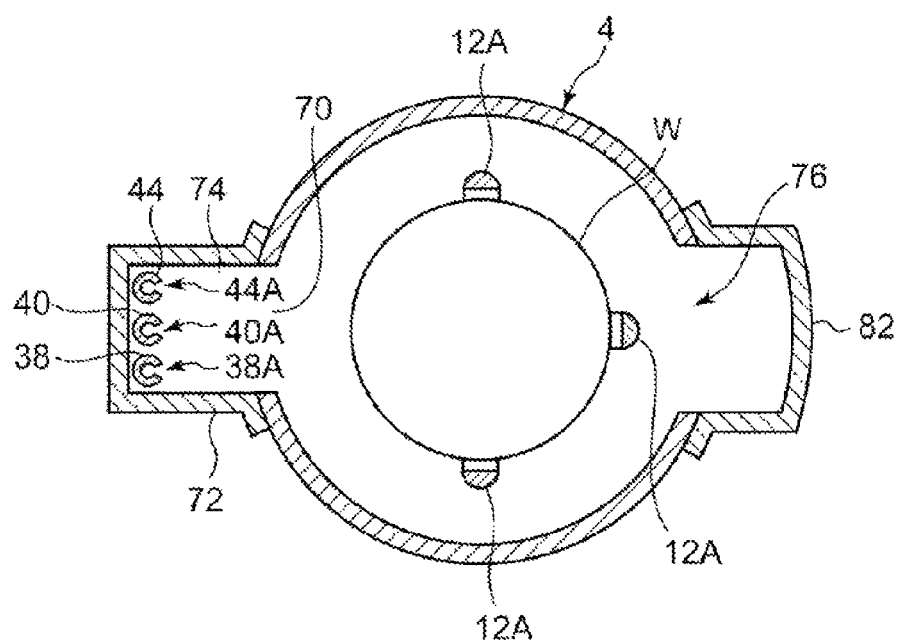
FIG. 2 is a horizontal cross sectional view showing the film forming apparatus of FIG. 1, in which a heating unit is omitted, according to some embodiments.

FIG. 1 is a vertical cross sectional view showing one example of a film forming apparatus, according to some embodiments. FIG. 2 is a horizontal cross sectional view showing the film forming apparatus of FIG. 1, in which a heating unit is omitted, according to some embodiments. Herein, the following description will be made with an example using a dichlorosilane (DCS) gas as a silicon-containing source gas, using an ammonia ($NH_3$) gas as a reaction gas (nitriding gas), using a $N_2$ gas as an inert gas and using a $N_2$ gas as a purge gas, to thereby form a silicon nitride film as a thin film.

As shown in FIGS. 1 and 2, the film forming apparatus 2 includes a cylindrical processing chamber 4 having a ceiling and an opening at the bottom end thereof. The entire body of the processing chamber 4 is made of, for example, quartz and a ceiling plate 6 made of quartz is air-tightly provided in the ceiling of the processing chamber 4. Further, a cylindrical manifold 8 made of, for example, stainless steel is attached to the opening of the processing chamber 4 with a seal member 10 such as an O-ring interposed therebetween. Alternatively, the processing chamber 4 and the manifold 8 may be integratedly formed in such manner that a cylindrical processing chamber made of quartz has a manifold portion also made of quartz.

The bottom end of the processing chamber 4 is supported by the manifold 8. A wafer boat 12 made of quartz serves as a holding unit which mounts a plurality of semiconductor wafers W as target objects in multi-levels thereon, and is vertically-movably inserted into or ejected from the interior of the processing chamber 4 from the underside of the manifold 8. In this embodiment, supports 12A of the wafer boat 12 support, for example, 50 to 150 sheets of wafers W having diameters of 300 mm in multi-levels by almost equal pitches.

The wafer boat 12 is mounted on a table 16 with a thermal insulation container 14 made of quartz interposed therebetween, and the table 16 is supported by an upper end of a rotation shaft 20 passing through a lid 18 made of, for example, stainless steel. The lid 18 opens and closes an opening disposed at the lower end of the manifold 8. The rotation shaft 20 is air-tightly sealed and rotatably supported by, for example, a magnetic fluid seal 22 inserted into a through portion of the rotation shaft 20. Further, a seal member 24 such as an O-ring is interposed between the periphery portion of the lid 18 and the lower end of the manifold 8 so that a sealing property of the interior of the processing chamber 4 is maintained.

The rotation shaft 20 is attached to a leading end of an arm 26 supported by an elevation mechanism (not shown) such as a boat elevator, so that the wafer boat 12 and the lid 18 are vertically movable together to be inserted into or ejected from the interior of the processing chamber 4.

The manifold 8 is configured to couple to a reaction gas supply unit 28 for supplying a nitriding gas such as an ammonia ($NH_3$) gas, as a reaction gas, a mixed gas supply unit 30 for supplying a mixed gas of an inert gas and a silicon-containing gas such as a dichlorosilane (DCS) gas as a source gas, and a purge gas supply unit 34 for supplying an inert gas such as a $N_2$ gas as a purge gas. The mixed gas supply unit 30 includes a gas reservoir tank 33, which is connected to an inert gas supply system 32 to form the mixed gas. As described above, the $N_2$ gas is used as the inert gas.

Specifically, the reaction gas supply unit 28 has a gas nozzle 38 made of quartz. The gas nozzle 38 passes through the sidewall of the manifold 8 and is bent to extend upward. A plurality of gas injection holes 38A spaced apart from each other is formed along the lengthwise direction of the gas nozzle 38, so that the ammonia gas is uniformly injected from each of the gas injection holes 38A in the horizontal direction. The gas nozzle of such a type is generally referred to as a gas distribution nozzle.

Similarly, the mixed gas supply unit 30 has a gas nozzle 40 made of quartz. The gas nozzle 40 passes through the sidewall of the manifold 8 and is bent to extend upward. A plurality of gas injection holes 40A (see FIG. 2) spaced apart from each other is formed along the lengthwise direction of the gas nozzle 40, so that the mixed gas of the DCS gas as the source gas and the $N_2$ gas as the inert gas is uniformly injected from each of the gas injection holes 40A in the horizontal direction.

Similarly, the purge gas supply unit 34 has a gas nozzle 44 made of quartz. The gas nozzle 44 passes through the sidewall of the manifold 8 and is bent to extend upward. A plurality of gas injection holes 44A (see FIG. 2) spaced apart from each other is formed along the lengthwise direction of the gas nozzle 44, so that the $N_2$ gas is uniformly injected from each of the gas injection holes 44A in the horizontal direction.

The gas nozzles 38, 40 and 44 are connected to gas passages 48, 50 and 54, respectively. Flow rate controllers 48A, 50A and 54A such as mass flow controllers are provided in the gas passages 48, 50 and 54, respectively and opening/closing valves 48B, 50B and 54B are provided in the downstream side of these flow rate controllers 48A, 50A and 54A, respectively. With this configuration, the gas passages 48, 50 and 54 can flow through the $NH_3$ gas, the DCS gas and the $N_2$ gas while controlling the flow rates of the $NH_3$ gas, the DCS gas and the $N_2$ gas, respectively.

The mixed gas supply unit 30 includes the gas reservoir tank 33. Specifically, the gas reservoir tank 33 has a certain capacity (or a volume) and is provided in the downstream side of the opening/closing valve 50B disposed in the gas passage 50 for the source gas. The inert gas supply system 32 has a gas passage 58 which is branched from the upstream side of the flow rate controller 54A disposed in the gas passage 54 for the purge gas supply unit 34. That is, the gas passage 58 connects the gas passage 54 and the gas reservoir tank 33 to allow the gas passage 54 and the gas reservoir tank 33 to communicate with each other.

In the branched gas passage 58, a flow rate controller 58A such as a mass flow controller and an opening/closing valve 58B are provided in order from the upstream side to the downstream side. When necessary, the inert gas such as the $N_2$ gas (also severs as the purge gas) is introduced into the gas reservoir tank 33 and stored temporarily in the gas reservoir tank 33 while the flow rate thereof is controlled, and the mixed gas of the source gas and the inert gas can be formed. Instead of being connected to the gas reservoir tank 33, the downstream side of the branched gas passage 58 may be connected to the gas passage 50 for the source gas between the gas reservoir tank 33 and the opening/closing valve 50B.

An opening/closing valve 60 is provided in the gas passage 50 in the downstream side of the gas reservoir tank 33, so that a supply of the mixed gas into the processing chamber 4 is controlled by controlling the opening/closing valve 60. A capacity (a volume) of the gas reservoir tank 33 is determined by a size of the processing chamber 4, and may be, for example, about 1 to 2 liters.

In a portion of the sidewall of the processing chamber 4, a vertically narrow and long opening 70 is formed by cutting out the sidewall of the processing chamber 4 in the vertical direction by a specific width. The opening 70 is covered with a vertically narrow and long partition wall 72, which is made of, for example, quartz and has a recess-shaped cross section, from the outside of the processing chamber 4. The partition wall 72 is air-tightly welded to the outer wall of the processing chamber 4 and forms a nozzle accommodating recess 74. The three gas nozzles 38, 40 and 44 are accommodated within the nozzle accommodating recess 74.

The opening 70 is formed to have a height long enough to cover all the wafers W mounted on the wafer boat 12 in the vertical direction. In a portion of the processing chamber 4 facing the nozzle accommodating recess 7, a narrow and long gas exhaust port 76 configured to vacuum-evacuate the inner atmosphere of the processing chamber 4 is formed 4 by, for example, cutting out the sidewall of the processing chamber 4 in a vertical direction.

A gas exhaust port cover 82, which is made of quartz and has a reverse C-shaped cross section to cover the gas exhaust port 76, is welded to the gas exhaust port 76. The gas exhaust port cover 82 extends upward along the sidewall of the processing chamber 4 and communicates with a gas outlet 84 positioned in an upper portion of the processing chamber 4. An exhaust system 86 is connected to the gas outlet 84. The exhaust system 86 includes an exhaust passage 88 connected to the gas outlet 84 and, in the exhaust passage 88, a pressure control valve 90 controlling the inner pressure of the processing chamber 4, a vacuum pump 92 and a scrubbing unit 93 removing harmful substances in exhaust gases are sequentially arranged. With this configuration, the processing chamber 4 can be vacuum-evacuated while the inner pressure of the processing chamber 4 is maintained at a predetermined level. In addition, a heating unit 94 is provided to enclose the outer periphery of the processing chamber 4 to thereby heat the processing chamber 4 and the wafers W within the processing chamber 4.

Overall operations of the film forming apparatus 2 configured as described above, for example, controls of a processing pressure, a processing temperature, a start and stop of supplying each of the gases by the opening/closing the valves, an introduction of the source gas or the inert gas into the gas reservoir tank 33 and gas flow rate, are carried out by a control unit 96 including, for example, a computer. The control unit 96 has a storage medium 98 in which programs for executing the above controls are stored. The storage medium 98 may include but is not limited to, for example, a flexible disc, a compact disc (CD), a CD-ROM, a hard disc, a flash memory or a DVD.

Figure 3:
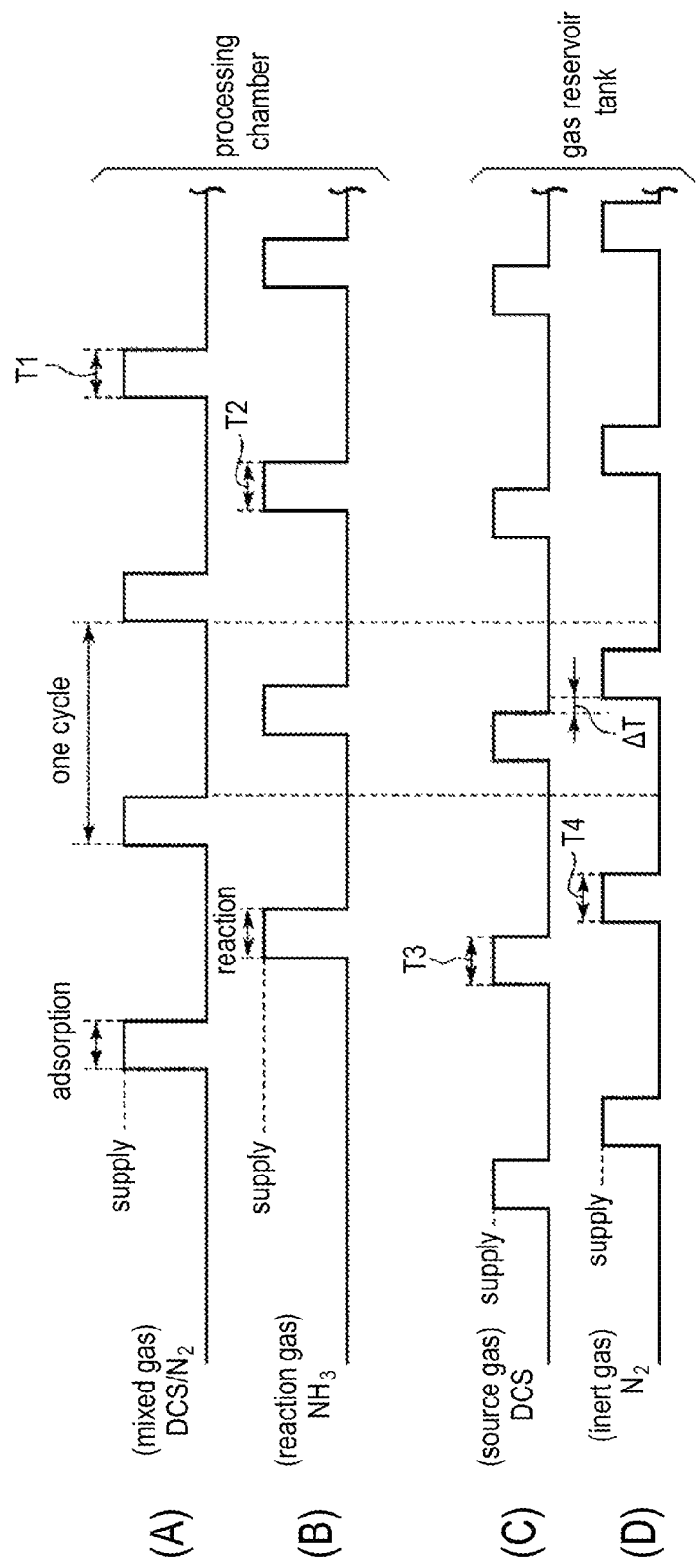
FIG. 3 is a timing diagram showing an operation of supplying each of the gases into a processing chamber and a charge of each of the gases in a gas reservoir tank, according to a first embodiment of a film forming method.

Hereinafter, the film forming method (i.e., a so called ALD method) according to some embodiments by using the film forming apparatus 2 configured as described above will be described with reference to FIG. 3. FIG. 3 shows a timing diagram illustrating an operation of supplying each of the gases into the processing chamber 4 and a charge of each of the gases in the gas reservoir tank 33, according to a first embodiment of the present disclosure.

In the film forming method according to the first embodiment of the present disclosure, a mixed gas is formed by mixing a source gas (e.g., a DCS gas) and an inert gas (e.g., a $N_2$ gas) in the gas reservoir tank 33 and the mixed gas and a reaction gas (e.g., a $NH_3$ gas) are supplied into the processing chamber 4, thereby forming a thin film (e.g., a silicon nitride film).

The wafer boat 12, on which a plurality of, for example, 50 to 150 sheets of wafers W being of a room temperature and having diameters of about 300 mm are mounted, is moved upward from the underside of the processing chamber 4 and loaded into the processing chamber 4 of a predetermined temperature. Then, the opening at the bottom end of the manifold 8 is closed by the lid 18 so that the interior of the processing chamber 4 is sealed.

The interior of the processing chamber 4 is maintained at a predetermined pressure by vacuum-evacuating the interior of the processing chamber 4. Further, by increasing an electric power supplied to the heating unit 94, the temperature of the wafers W increases until it reaches a processing temperature and then is maintained at the processing temperature. The mixed gas is formed by mixing the DCS gas and the $N_2$ gas as the inert gas in the gas reservoir tank 33 and is supplied from the mixed gas supply unit 30 into the processing chamber 4. The $NH_3$ gas as the reaction gas is supplied from the reaction gas supply unit 28 into the processing chamber 4. The $N_2$ gas as the purge gas is supplied from the purge gas supply unit 34 into the processing chamber 4.

Specifically, a start and stop of supplying the $NH_3$ gas into the processing chamber 4 is carried out by opening/closing the opening/closing valve 48B provided in the gas passage 48 of the reaction gas supply unit 28. A start and stop of supplying the purge gas into the processing chamber 4 is carried out by opening/closing the opening/closing valve 54B provided in the gas passage 54 of the purge gas supply unit 34.

A start and stop of introducing the source gas into the gas reservoir tank 33 is carried out by opening/closing the opening/closing valve 50B for the source gas provided in the upstream side of the gas passage 50 of the mixed gas supply unit 30. A start and stop of introducing of the inert gas into the gas reservoir tank 33 is carried out by opening/closing the opening/closing valve 58B provided in the gas passage 58 of the inert gas supply system 32. A start and stop of supplying the mixed gas formed in the gas reservoir tank 33 into the processing chamber 4 is carried out by opening/closing the opening/closing valve 60 for the mixed gas provided in the downstream side of the gas passage 50 of the mixed gas supply unit 30.

The respective gases are injected from the gas injection holes 38A, 40A and 44A of the corresponding gas nozzles 38, 40 and 44 into the processing chamber 4 in the horizontal direction, and are distributed across the surfaces of the wafers W rotatably supported by the wafer boat 12, thereby forming the silicon nitride film as the thin film on the surfaces of the wafers W. The gases are then discharged via the gas exhaust port 76 facing the gas nozzles 38, 40 and 44.

As described above, when a film forming process starts, the exhaust system 86 operates to rotate and drive the vacuum pump 92 continuously to thereby vacuum-evacuate the inner atmosphere of the processing chamber 4. Reaction by-product generated by the reaction in the processing chamber 4 and unreacted gas ingredient are discharged together with the exhaust gas via the exhaust system 86. At this time, the harmful substances contained in the exhaust gas are removed by the scrubbing unit 93.

<First Embodiment of the Method of Forming the Film>

The first embodiment shown in FIG. 3 will be described. Timing diagrams (A) and (B) of FIG. 3 represent an operation of supplying each of the gases into the processing chamber 4, and timing diagrams (C) and (D) of FIG. 3 represent an operation of supplying each of the gases into the gas reservoir tank 33. In the first embodiment as shown in FIG. 3, both the mixed gas and the reaction gas are intermittently supplied into the processing chamber 4. Specifically, both gases are alternately and repeatedly supplied.

In the first embodiment, an adsorbing process (see the timing diagram (A) of FIG. 3), in which the mixed gas (the DCS gas+the $N_2$ gas) is supplied into the processing chamber 4 and then is adsorbed on the surfaces of the wafers W, and a reacting process (see the timing chart (B) of FIG. 3), in which the reaction gas (the $NH_3$ gas) is supplied into the processing chamber 4 and reacts with (nitride) the mixed gas adsorbed on the surfaces of the wafers W to form the silicon nitride film as the thin film, are alternately and repeatedly carried out by a plurality of times. In this embodiment, the reaction gas may be activated by a heat from the heating unit 94, so that the reaction is accelerated. When supplying the mixed gas, an opening degree of the pressure control valve 90 may be changed to become smaller in order to accelerate the adsorption of the mixed gas on the surfaces of the wafers W in the processing chamber 4.

The mixed gas and the reaction gas are supplied in a pulse-like manner. A time period between a forefront of one adsorbing process and a forefront of next adsorbing process forms one cycle. Although the number of cycles per one film forming process is determined by, for example, a desired film thickness, one film forming process may be carried out for several ten cycles to several hundred cycles. A total film thickness may be, for example, about 5 nm to 50 nm.

Though not shown in FIG. 3, the $N_2$ gas as the purge gas is continuously supplied into the processing chamber 4 after a start of the film forming process, to thereby accelerate gas flows of the mixed gas and the reaction gas and facilitate a discharge of a residual gas remaining in the processing chamber 4 during a pause period for which both the mixed gas and the reaction gas are not supplied. The purge gas may flow as described above, or may not flow.

During the film forming process as described above, the mixed gas of the source gas (e.g., the DCS gas) and the inert gas (e.g., the $N_2$ gas) are formed in the gas reservoir tank 33. Specifically, during a period in each cycle for which the supply of the mixed gas into the processing chamber 4 is paused (i.e., while the opening/closing valve 60 for the mixed gas provided in the gas passage 50 is closed in each cycle), the DCS gas and the $N_2$ gas are introduced into the gas reservoir tank 33 in the pulse-like manner and temporarily stored in the gas reservoir tank 33 to form the mixed gas (see the timing diagrams (C) and (D) of FIG. 3).

Before the first cycle of the film forming process is carried out, the DCS gas and the $N_2$ gas are introduced into the gas reservoir tank 33 and the mixed gas for use in the first cycle is formed. A supply period of the DCS gas and a supply period of the $N_2$ gas are slightly offset from each other by a time period $\Delta T$ in order to prevent backflows of the gases. If a supply pressure of the DCS gas and a supply pressure of the $N_2$ gas are identical to each other, the backflows do not occur and thus, both gases may be simultaneously introduced into the gas reservoir tank 33. The supply period (i.e., a pulse width) of the DCS gas or the supply period (i.e., a pulse width) of the $N_2$ gas may be controlled appropriately in order to adjust the concentration (i.e., a volume ratio) of the DCS gas in the mixed gas.

Regarding processing conditions in the film forming process, the processing temperature ranges from about 450 degrees C. to about 700 degrees C. and the processing pressure ranges from about 0.133 Pa to about 1330 Pa. As described above, the processing pressure is set to be high within the aforementioned pressure range during the adsorbing process. Further, duration of one cycle is about ten seconds to several ten seconds, a supply period T1 of the mixed gas during the adsorbing process is about one to several seconds, and a supply period T2 of the $NH_3$ gas during the reacting process is about one to several seconds.

Further, each of a supply period T3 of the DCS gas and a supply period T4 of the $N_2$ gas into the gas reservoir tank 33 is about one to several seconds. A flow rate of the DCS gas is, for example, about 2 slm, while a flow rate of the $N_2$ gas is, for example, about 0.2 slm. Each of the periods T1 to T4 as described herein is by way of example only, and is not limited to the aforementioned numerical value. Further, the inner pressure of the gas reservoir tank 33 ranges from, for example, about 350 Torr to about 450 Torr.

Since the thin film is formed by using the mixed gas, which is formed by diluting the source gas by mixing the source gas (e.g., the DCS gas) and the inert gas (e.g., the $N_2$ gas), and the reaction gas (e.g., the $NH_3$ gas) as described above, it is possible to improve the in-plane uniformity of film thickness while maintaining a high film forming rate. In this case, the volume ratio of the source gas to the mixed gas in the gas reservoir tank 33 ranges from 1/2 (50%) to 1/8 (12.5%).

If the volume ratio of the source gas is higher than 1/2, the concentration of the source gas rises excessively. In this case, an adsorbing amount of the source gas in a central portion of the rotating wafer W becomes larger than that in a periphery portion of the wafer W and the film is formed to have a convex shaped cross section in which a cross section of the film thickness rises in the central portion of the wafer W, so that the in-plane uniformity of film thickness deteriorates. On the contrary, if the volume ratio of the source gas is lower than 1/8, the concentration of the source gas lowers excessively. In this case, an adsorbing amount of the source gas in the periphery portion of the rotating wafer W becomes larger than that in the central portion of the wafer W and the film is formed to have a concave shaped cross section in which a cross section of the film thickness sinks in the central portion of the wafer W, so that the in-plane uniformity of the film thickness deteriorates.

According to the film forming method of the present disclosure in which the thin film is formed on the surface of the target objects by using the source gas and the reaction gas, the thin film is formed by mixing the source gas and the inert gas in the gas reservoir tank to form the mixed gas and supplying the mixed gas and the reaction gas into the processing chamber. Accordingly, it is possible to improve the in-plane uniformity of film thickness while maintaining the high film forming rate.

<Evaluation of the Film Forming Method, According to Some Embodiments>

Experiments for the evaluation in the film forming method of the present disclosure were carried out. Below, evaluation results will be described with reference to FIG. 4. In the experiments, the thin film was formed through the film forming method as represented by the timing diagrams in FIG. 3 when the film forming apparatus shown in FIGS. 1 and 2 is utilized. The silicon nitride film as the thin film was formed by using the DCS gas as the source gas, using the $NH_3$ gas as the reaction gas, i.e., the nitriding gas, and using the $N_2$ gas as the inert gas.

Figure 4:
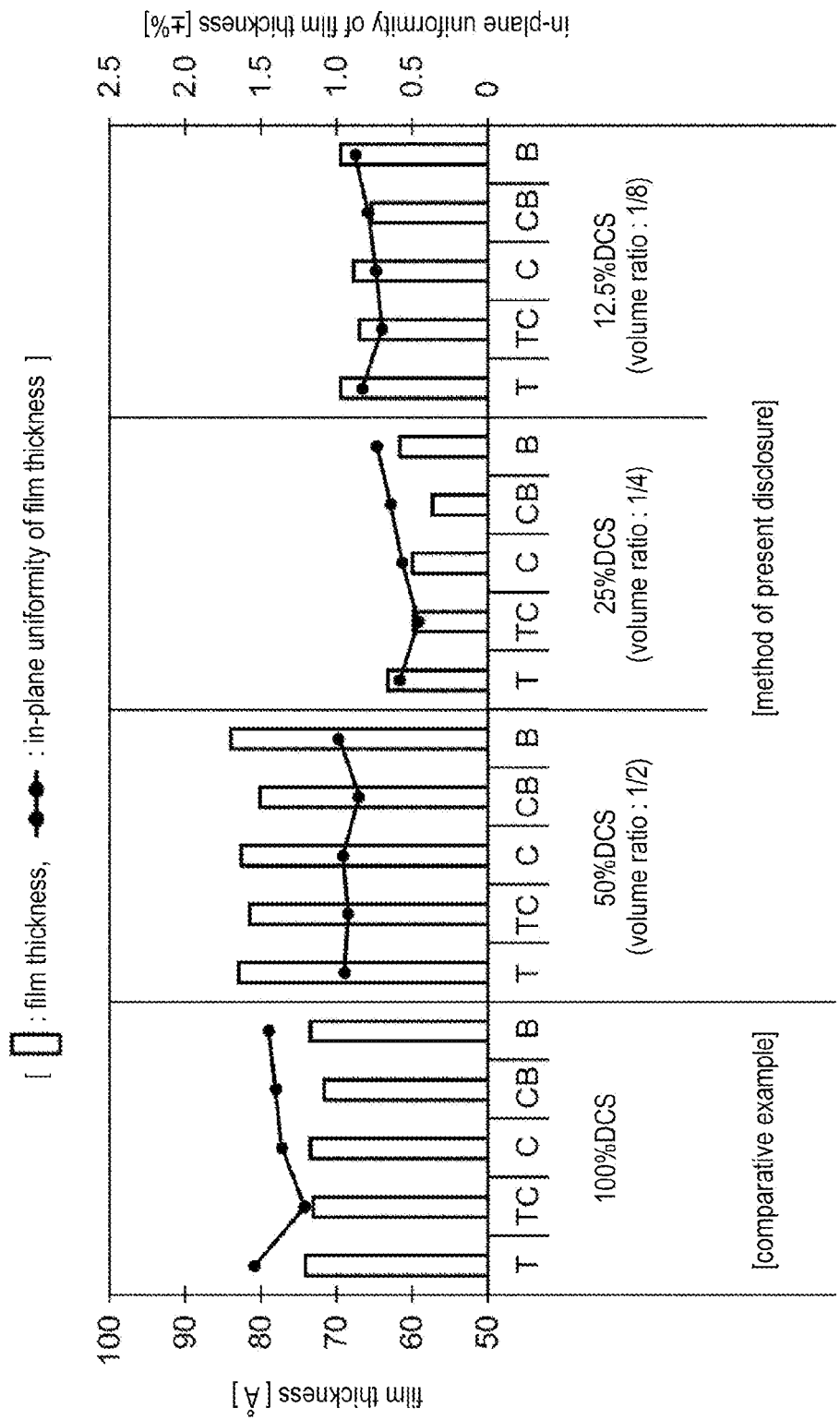
FIG. 4 is a graph showing an evaluation result of the film forming method, according to some embodiments.

The film thickness and the in-plane uniformity of film thickness are shown in FIG. 4. FIG. 4 is a graph showing the evaluation result the film forming method of the present disclosure. Herein, the in-plane uniformities of film thickness were obtained by measuring the film thicknesses while changing the ratio of the DCS gas to the mixed gas to 50% (the volume ratio: 1/2), 25% (the volume ratio: 1/4) and 12.5% (the volume ratio: 1/8), respectively. As a comparative example, the in-plane uniformities of film thickness obtained by the conventional film forming method using the DCS gas having the concentration of 100% (without being diluted) are also shown in FIG. 4.

In all cases, film forming was performed for 100 to 140 cycles. In the graph shown in FIG. 4, a left vertical axis is scaled by the film thickness while a right vertical axis is scaled by the in-plane uniformity of film thickness. The wafer boat 12 supporting 125 sheets of the semiconductor wafers W was accommodated in the processing chamber 4. The wafer boat 12 is vertically divided into five regions which denote a top "T", a top center "TC", a center "C", a center bottom "CB" and a bottom "B" from the top to the bottom, and the film thicknesses are measured for the wafers W in each of the five regions.

As shown in FIG. 4, in the comparative example, the film forming rate was relatively high such that the film thickness of about 70 Å to 73 Å was obtained, but the quality of in-plane uniformity of film thickness is not so good since the in-plane uniformity of film thickness around ±1.5% was obtained in all the regions T, TC, C, CB and B. On the contrary, in the film forming method of some embodiments of the present disclosure using the DCS gas of 50% (i.e., the volume ratio: 1/2), the film thickness of about 80 Å, which is better than that of the comparative example, was obtained. Further, the in-plane uniformity of film thickness was around ±1.0%, which is better than that of the comparative example, in all the regions T, TC, C, CB and B.

Further, in the film forming method of the present disclosure using the DCS gas of 25% (i.e., the volume ratio: 1/4), the film thickness was about 60 Å which is slightly lower than that of the comparative example, but the in-plane uniformity of film thickness was about ±0.5%, which is better than that of the comparative example, in all the regions T, TC, C, CB and B. Furthermore, in the film forming method of the present disclosure using the DCS gas of 12.5% (i.e., the volume ratio: 1/8), the film thickness was about 68 Å, which is slightly lower than that of the comparative example, but the in-plane uniformity of film thickness was around ±0.8%, which is better than that of the comparative example, in all the regions T, TC, C, CB and B. From the aforementioned result, it can be known that the volume ratio of the source gas to the mixed gas may range from 1/2 (50%) to 1/8 (12.5%). If the volume ratio of the source gas to the mixed gas is lower than 1/8 (12.5%), the concentration of the source gas for forming the film lowers excessively. It is undesirable because the source gas cannot be sufficiently supplied to all the wafers W.

<Second and Third Embodiments>

In the first embodiment, the mixed gas and the reaction gas are alternately supplied in the pulse-like manner into the processing chamber 4 as shown in the timing diagrams (A) and (B) of FIG. 3. However, supply of the mixed gas and the reaction gas are not limited thereto, and the mixed gas and the reaction gas may be supplied as shown in FIGS. 5A and 5B. FIGS. 5A and 5B are timing diagrams representing an operation of supplying each of the gases into the processing chamber 4 according to a second and a third embodiment of the film forming method of the present disclosure, respectively.

In the second embodiment shown in FIG. 5A, the mixed gas and the reaction gas are intermittently supplied in a pulse-like manner, and both gases are supplied into the processing chamber 4 at the same time. In this case, a period during which neither of the gases are supplied is also set as a purge period. In the third embodiment shown in FIG. 5B, the mixed gas is intermittently supplied in a pulse-like manner, while the reaction gas is continuously supplied. In the second and the third embodiment, the same operational effect as in the first embodiment can be obtained.

<Fourth Embodiment>

In the first embodiment, the purge gas is continuously supplied into the processing chamber 4 using the purge gas supply unit 34 during the film forming process. It will be appreciated that the supply of the purge gas is not limited thereto and the purge gas may be intermittently supplied as described in the following fourth embodiment.

FIG. 6 is timing chart showing an operation of supplying each of the gases into the processing chamber 4 according to the fourth embodiment of the film forming method of the present disclosure. Since a timing diagram representing the operation of supplying each of the gases into the gas reservoir tank in the fourth embodiment is identical to that in the first embodiment as shown in FIG. 3, said supply manner is omitted in FIG. 6. Further, the timing diagrams (A) and (B) of FIG. 6 are identical to the timing diagrams (A) and (B) of FIG. 3, respectively.

In the fourth embodiment, the purging process, in which the residual gas remaining in the processing chamber 4 is discharged, is carried out at least one of before supplying the mixed gas and before supplying the reaction gas. Specifically, the purging process may be carried out by both: before a mixed gas supplying process (i.e., the adsorbing process) and before a reaction gas supplying process (i.e., the reacting process). Alternatively, the purging process may be carried out by only one of before the adsorbing process or before the reacting process.

In of the example shown in FIG. 6, the purging process is carried out by both: before the adsorbing process and before the reacting process. In other words, the purging process is carried out by supplying the inert gas, for example, the $N_2$ gas into the processing chamber 4 through the purge gas supply unit 34 (see FIG. 1) during each of the pause periods between the adsorbing process for supplying the mixed gas and the reacting process for supplying the reaction gas (see the timing diagram (C) of FIG. 6). Further, in the example shown in FIG. 6, the purging process may be carried out before the first adsorbing process, so that the residual gas remaining in the processing chamber 4 is certainly discharged.

In the purging process, the purge gas may be supplied throughout the entire purge period or may be supplied in the pulse-like manner during the purge period. In the case of the pulse-like manner, the number of pulse per one purge period may be one or more. In order to show purge effects, the purge gas may be supplied in a plurality of pulses to thereby result in an impact that is generated at the start and stop of supplying the gases into the processing chamber 4 by a plurality of times and facilitate the discharge of the residual gas.

Although the purge gas of two pulses is supplied for each of the purge periods T5 and T6 in the timing diagram (C) of FIG. 6, the number of pulses is not limited thereto and the purge gas of more than two pulses may be supplied. The purge periods T5 and T6 may be, for example, about 1 to 30 seconds and a duration T7 of one pulse may be, for example, about 1 to 5 seconds.

By performing the purging process as described above, the residual gas remaining in the processing chamber 4 can be effectively discharged outside of the processing chamber 4. As a result, since the purge effect on a device pattern is improved, it is possible to suppress occurrence of seam-like defects in a bottom of the pattern, for example. In particular, if the purge gas is supplied in a plurality of number of pulses per purge period, the purge effect can be further improved. The aforementioned purging process can also be applied to the second embodiment as shown in FIG. 5A.

<Modified Example of Film Type>

By way of example, an impurity-free silicon nitride film (SiN film) may be formed in the above embodiments. However, the present disclosure is not limited thereto and may be configured to form an impurity-containing silicon nitride film by introducing an impurity gas containing an impurity element into the processing chamber 4. Such an impurity element may include, for example, boron (B) or carbon (C), and a SiBN film or a SiCN film may be formed as an impurity-containing silicon nitride film. In this case, the impurity gas may include a $BCl_3$ gas or a hydrocarbon gas such as an ethylene gas or the like.

Figure 7A:
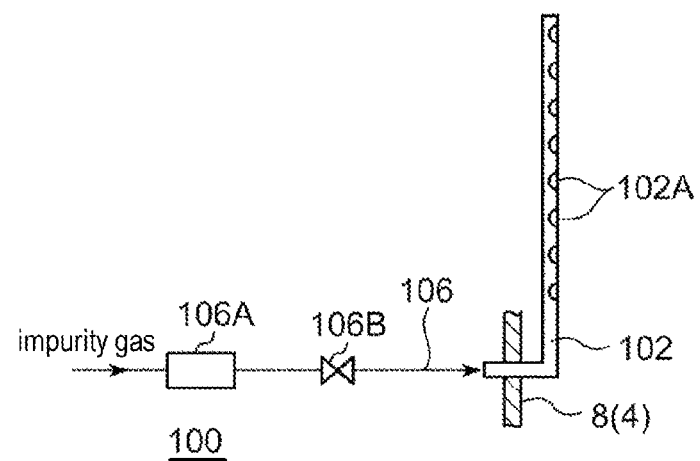
FIGS. 7A and 7B show examples of an impurity gas supply unit.
Figure 7B:
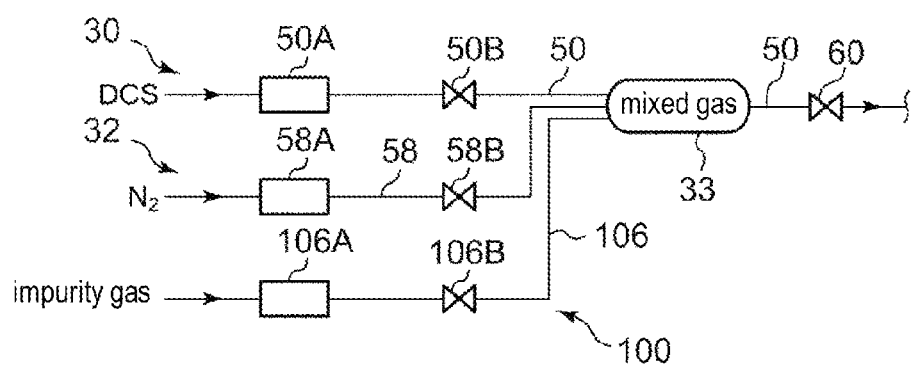

Examples of the film forming apparatus 2 for supplying such an impurity gas are shown in FIGS. 7A and 7B. FIGS. 7A and 7B illustrate examples of an impurity gas supply unit 100, according to some embodiments. It will be appreciated that except for the impurity gas supply unit 100, other configurations of the film forming apparatus 2 are identical to those as shown in FIGS. 1 and 2. The impurity gas supply unit 100 shown in FIG. 7A has a gas nozzle 102 provided in the processing chamber 4. The gas nozzle 102 is connected to a gas passage 106 through which the impurity gas flows. A flow rate controller 106A such as a mass flow controller and an opening/closing valve 106B are provided in the gas passage 106. The impurity gas can be directly supplied into the processing chamber 4 from a plurality of gas injection holes 102A formed in the gas nozzle 102.

In the impurity gas supply unit 100 shown in FIG. 7B, a leading end of a gas passage 106 through which the impurity gas flows is directly connected to the gas reservoir tank 33, and a flow rate controller 106A and an opening/closing valve 106B are provided in the gas passage 106. Thus, the impurity gas is introduced into the gas reservoir tank 33 when the mixed gas is formed in the gas reservoir tank 33. With this configuration, the mixed gas of the DCS gas, the $N_2$ gas and the impurity gas can be formed and the mixed gas containing the impurity gas can be supplied into the processing chamber 4. As a result, it is possible to form an impurity-containing silicon nitride film.

<Example of Film Forming Apparatus Using Activating Unit>

Figure 8:
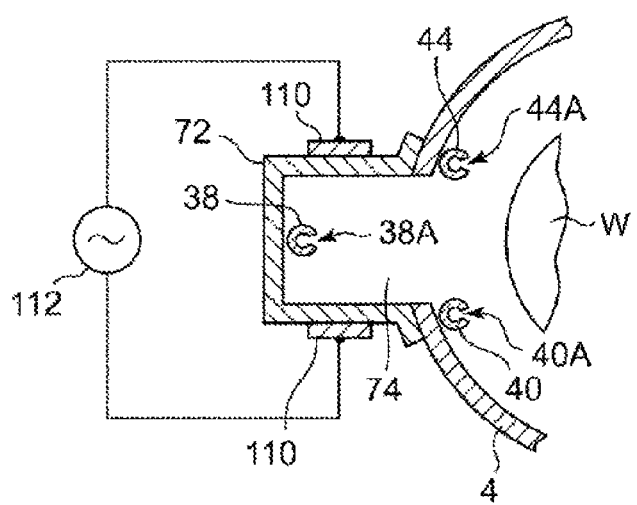
FIG. 8 is a horizontal cross sectional view showing one example of a film forming apparatus using an activating unit, according to some embodiments.

By way of example, the reaction gas may be activated by heat in the above embodiments. However, the present disclosure is not limited thereto and can be applied to a film forming apparatus using an activating unit generating a plasma as shown in FIG. 8. FIG. 8 shows one example of the film forming apparatus using the activating unit. It will be appreciated that other configurations of the film forming apparatus shown in FIG. 8 are identical to those as shown in FIGS. 1 and 2. The film forming apparatus is configured to generate a plasma using the activating unit and activate the reaction gas by the plasma, thereby accelerating a film forming reaction.

In the film forming apparatus, plasma electrodes 110 as activating units are provided along the outer wall of the partition wall 72 partitioning the nozzle accommodating recess 74 provided in the sidewall of the processing chamber 4 shown in FIG. 8. A high frequency electric power is applied to the plasma electrodes 110 from a high frequency electric power supply 112. As such, a plasma is generated in the nozzle accommodating recess 74. In this case, the interior of the nozzle accommodating recess 74 serves also as a plasma chamber.

In order not to activate other gases except the reaction gas, only the gas nozzle 38 for the reaction gas is received in the nozzle accommodating recess 74, and other gas nozzles 40 and 44 are disposed in a space between the inner wall of the cylindrical processing chamber 4 and the wafers W (or the wafer boat 12). With this configuration, the film forming rate can be improved by the plasma and also the processing temperature of the film forming process can be lowered.

By way of example, the nozzle accommodating recess 74 may be provided in the processing chamber 4 in the above embodiments. However, the present disclosure can also be applied to a processing chamber that does not have the nozzle accommodating recess 74. In this case, each of the gas nozzles 38, 40 and 44 may be disposed in the space between the inner wall of the cylindrical processing chamber 4 and the wafer boat 12.

By way of example, a so-called batch type film forming apparatus capable of processing a plurality of semiconductor wafers at once is described in the above embodiments. However, the present disclosure is not limited thereto and may be also applied to a so-called single type film forming apparatus capable of processing the semiconductor wafers one by one.

By way of example, the $N_2$ gas is used as the inert gas in the above embodiments. However, the present disclosure is not limited thereto and may use a noble gas such as Ar, He, or the like. Further, by way of example, the DCS gas is used as the silicon-containing source gas in the above embodiments. However, the silicon-containing gas is not limited to the DCS gas, and may include at least one gas selected from a group consisting of dichlorosilane (DCS), hexachlorosilane (HCD), monosilane ($SiH_4$), disilane ($Si_2H_6$), hexamethyldisilazane (HMDS), trichlorosilane (TCS), disilylamin (DSA), trisilylamin (TSA), bis(tertiary-butylamino)silane (BTBAS), bis(diethylamino)silane (BDEAS), diisopropylaminosilane (DIPAS) and tris(dimetylamino)silane (3DMAS).

By way of example, a nitriding gas is used as the reaction gas and the NH$_3$ gas is used as the nitriding gas in the above embodiments. However, the present disclosure is not limited thereto and may use nitrogen dioxide (N$_2$O), nitrogen monoxide (NO) or the like as the nitriding gas. Further, by way of example, the silicon nitride film is formed by using the silicon-containing source gas as the source gas in the above embodiments. However, the present disclosure is not limited thereto and may be configured to form a metal nitride film, a metal oxide film or the like as the thin film by using a metallic compound gas containing a metal as the source gas.

An organo-metallic compound gas may be used as the metallic compound gas. The organo-metallic compound gas may include at least one gas selected from a group consisting of trimethylaluminium (TMA), tetrakis(dimethylamino)hafnium (TDMAH), tetrakis(ethtymethylamino)hafnium (TEMAH), tetrakis(ethylmethylamino)zirconium (TEMAZ) and tetrakis(dimethylamino)titanium (TDMAT). In this case, the reaction gas may include at least one gas selected from a group consisting of a nitriding gas, an oxidizing gas and a reducing gas.

By way of example, the semiconductor wafer is described as the target objects. The semiconductor wafer may include not only silicon substrates but also compound semiconductor substrates such as GaAs, SiC or GaN semiconductor substrates. Further, the target object is not limited to the above-described substrates, and the present disclosure can be applied to glass substrates used in liquid crystal displays, a ceramic substrate or the like.

In the method of forming the film on the surface of the target objects by using the source gas and the reaction gas, the mixed gas is formed by mixing the source gas and the inert gas in the gas reservoir tank and the mixed gas and the reaction gas are supplied into the processing chamber, thereby forming the thin film. Accordingly, it is possible to improve the in-plane uniformity of film thickness while maintaining the high film forming rate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a thin film on a surface of target objects in a vacuum-evacuable processing chamber by using a source gas and a reaction gas, the method comprising:
   forming a mixed gas by mixing the source gas and an inert gas in a gas reservoir tank; and
   supplying the mixed gas and the reaction gas into the processing chamber,
   wherein a volume ratio of the source gas to the mixed gas in the gas reservoir tank ranges from 1/2 to 1/8.

2. The method of claim 1, wherein the mixed gas and the reaction gas are intermittently supplied.

3. The method of claim 2, wherein the mixed gas and the reaction gas are alternately and repeatedly supplied.

4. The method of claim 2, wherein the mixed gas and the reaction gas are simultaneously supplied.

5. The method of claim 2, wherein a purge gas is continuously supplied into the processing chamber.

6. The method of claim 2, further comprising:
   purging a residual gas remaining in the processing chamber before at least one of supplying the mixed gas and supplying the reaction gas.

7. The method of claim 6, wherein, during the purging, an inert gas is supplied in a pulse-like manner by a plurality of times.

8. The method of claim 1, wherein the mixed gas is intermittently supplied and the reaction gas is continuously supplied.

9. The method of claim 1, wherein the source gas and the inert gas are introduced into the gas reservoir tank in a timely offset manner.

10. The method of claim 1, wherein the source gas and the inert gas are introduced into the gas reservoir tank simultaneously.

11. The method of claim 1, wherein the reaction gas includes a gas selected from a group consisting of a nitriding gas, an oxidizing gas and a reducing gas.

12. The method of claim 1, wherein the reaction gas is activated by heat.

13. The method of claim 1, wherein the reaction gas is activated by a plasma.

14. The method of claim 1, wherein an impurity gas containing an impurity element is supplied into the processing chamber.

15. The method of claim 14, wherein the impurity gas is introduced into the gas reservoir tank.

* * * * *